United States Patent [19]
McAnally et al.

[11] Patent Number: 5,788,566
[45] Date of Patent: Aug. 4, 1998

[54] INTEGRATED COOLING FAN AND FINGER GUARD ASSEMBLY

[75] Inventors: Andrew McAnally; Stephen Cook, both of Georgetown; Gilberto Hernandez, Phlugerville, all of Tex.

[73] Assignee: Dell U.S.A., L.P., Austin, Tex.

[21] Appl. No.: 739,683

[22] Filed: Oct. 29, 1996

[51] Int. Cl.[6] .................................................. H05K 7/20
[52] U.S. Cl. ........................ 454/184; 415/213.1; 361/695
[58] Field of Search ...................... 454/184; 361/695, 361/697; 415/213.1, 213.4; 416/247 R

[56] References Cited

U.S. PATENT DOCUMENTS

| | | | |
|---|---|---|---|
| 4,724,747 | 2/1988 | Sturm et al. | 454/184 |
| 4,834,615 | 5/1989 | Mauch et al. | 415/213.1 |
| 5,208,730 | 5/1993 | Tracy | 415/213.1 |
| 5,225,629 | 7/1993 | Garrett. | |
| 5,448,143 | 9/1995 | Pecone. | |
| 5,532,428 | 7/1996 | Radloff. | |
| 5,615,998 | 4/1997 | Kodama et al. | 415/213.1 X |

FOREIGN PATENT DOCUMENTS

| | | | |
|---|---|---|---|
| 32 10 164 | 10/1983 | Germany | 415/213.1 |
| 5-29781 | 2/1993 | Japan | 361/695 |
| 5-55771 | 3/1993 | Japan | 361/695 |
| 5-167280 | 7/1993 | Japan | 361/695 |
| 6-97687 | 4/1994 | Japan | 361/695 |

OTHER PUBLICATIONS

D. H. Kekas et al., "Snap–Together Cooling Fan Assembly", IBM Technical Disclosure Bulletin, vol. 22, No. 6, IBM Corporation, Nov. 1979, pp. 2391 and 2392.

*Primary Examiner*—Harold Joyce
*Attorney, Agent, or Firm*—Haynes and Boone L.L.P.

[57] ABSTRACT

A fan/finger guard assembly for a computer, or other types of electronic equipment in which a housing is provided for receiving a fan rotor and a motor and having at least one opening extending therethrough. The housing extends between, and in abutment with, a mounting plate attached to a wall of the enclosure and a finger guard for covering the fan rotor. At least one locking member extends from the mounting member and into the opening in the housing, and at least one locking member extends from the finger guard and into the opening in the housing and in engagement with the locking member of the of mounting plate. As a result, the assembly is locked to the wall of the enclosure.

17 Claims, 2 Drawing Sheets

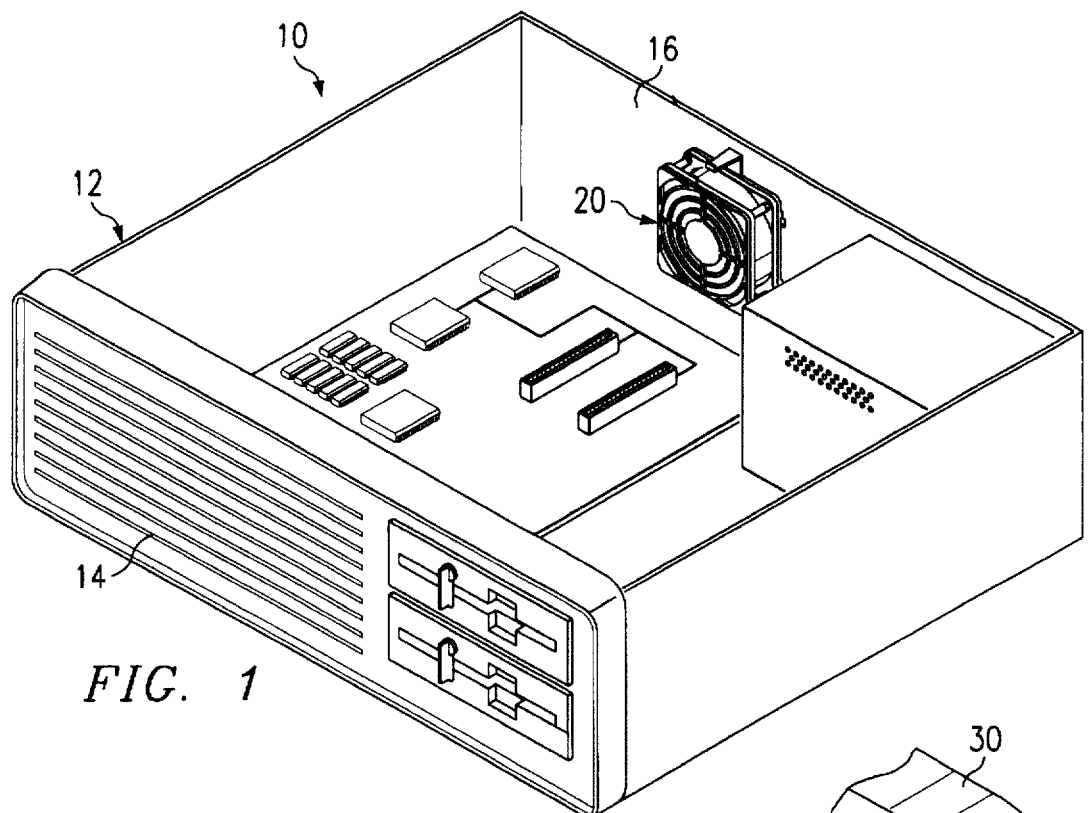
*FIG. 1*
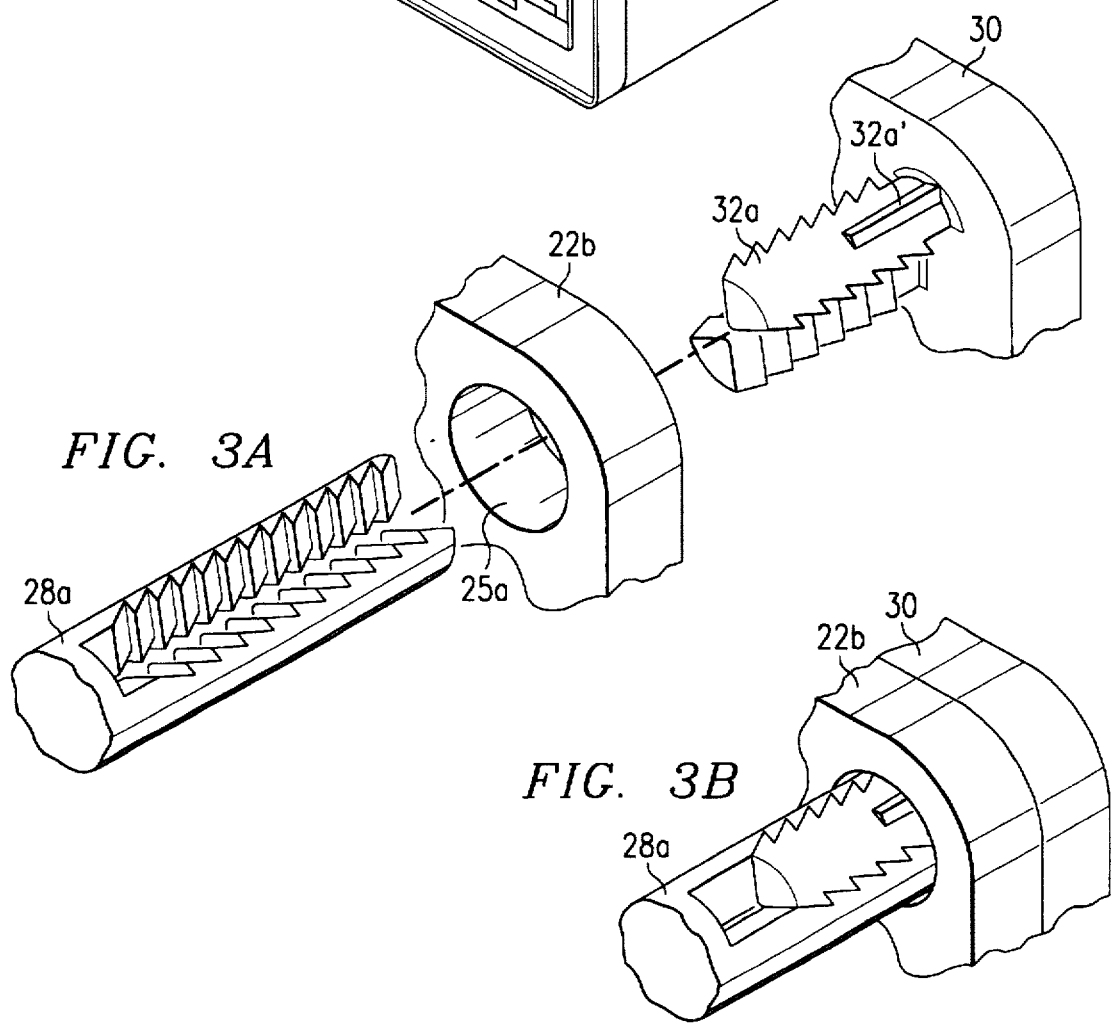
*FIG. 3A*
*FIG. 3B*

INTEGRATED COOLING FAN AND FINGER GUARD ASSEMBLY

TECHNICAL FIELD

The invention relates generally to the field of electronic equipment, such as computers, and the like and, more particularly, to an internal, integrated fan/finger guard assembly for cooling the equipment.

BACKGROUND OF THE INVENTION

Desktop and laptop computers, as well as many other types of electronic equipment, incorporate internal fans to cool the equipment or specific components of the equipment. For example, cooling fans are often placed within the enclosure, or chassis, of a computer to cool the hard drive, the processor chip and other components that generate heat during use. However, the mounts for the fans take up an inordinate amount of internal space in the enclosure. Also, since finger guards are usually provided with the fans for safety reasons, the space problem is compounded, especially since the finger guards are designed as independent units with their own mounting systems and not as a part of an overall fan mounting scheme. In addition, the finger guards involve additional parts which increases the manufacture and assembly time.

Therefore, what is needed is a fan/finger guard assembly which takes up minimal space, yet is easy to assemble and mount to the equipment enclosure.

SUMMARY OF THE INVENTION

The present invention, accordingly, provides a fan/finger guard assembly for a computer, or other types of electronic equipment, which enables the fan as well as the finger guard to be easily mounted to an enclosure without significantly increasing the space normally taken up by the fan. To this end, the assembly of the present invention includes a housing for receiving the fan rotor, or propeller, and a motor. The housing extends between, and in abutment with, a mounting frame and a finger guard for covering the fan rotor. The mounting frame is provided with hooks and a snap finger for mounting the frame to a wall of the enclosure. At least one locking member extends from the mounting frame and into at least one opening in the housing, and at least one locking member extends from the finger guard and into the latter opening where it engages with the locking member of the mounting frame to lock the finger guard and the housing to the mounting frame.

An advantage is thus achieved with the assembly of the present invention since the fan and the finger guard can be installed in the enclosure with a minimum of parts and in a compact space no greater than the space normally taken up by the fan.

Another advantage of the assembly of the present invention is that it can be easily installed in the enclosure in the foregoing manner using hooks and a snap finger for attaching the mounting frame to the enclosure, and using locking posts for attaching the fan housing and the finger guard to the mounting frame.

BRIEF DESCRIPTION OF THE DRAWINGS

FIG. 1 is a perspective view of a computer enclosure with the top wall removed to reveal the fan/finger guard assembly of the present invention mounted in the enclosure.

FIGS. 3A and 3B are enlarged partial views of portions of the locking members of the fan/finger guard assembly of FIGS. 1 and 2.

DETAILED DESCRIPTION OF THE PREFERRED EMBODIMENT

Figure 2:
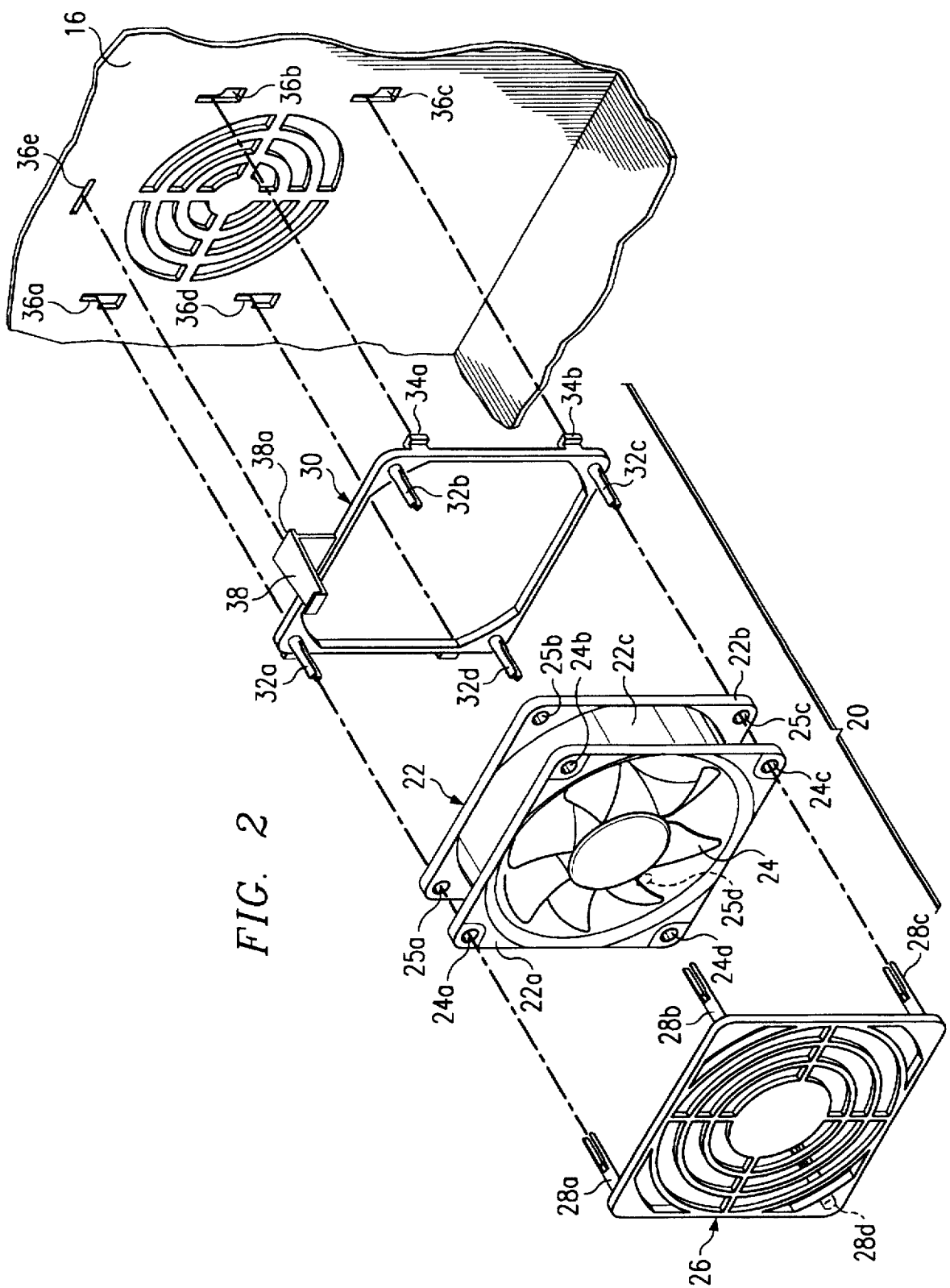
FIG. 2 is an enlarged, exploded, perspective view of the fan/finger guard assembly and a portion of the back wall of the enclosure of FIG. 1.

Referring to FIG. 1 of the drawing, the reference numeral 10 refers, in general, to a desktop or laptop computer having an enclosure 12 including a front plate, or wall, 14 and a rear wall 16. The fan/finger guard assembly of the present invention is shown in general by the reference numeral 20 and is mounted to the rear wall 16. For the convenience of presentation, the other components and parts of the computer are not shown, since they do not form a part of the present invention.

With reference to FIG. 2, the assembly 20 consists of a fan housing 22 that houses a rotor 24 that is mounted in conventional bearings, or the like, and is powered by an electric motor. Since the bearings and the motor are conventional and do not form a part of the present invention, they are not shown. The housing 22 includes a front plate 22a, a rear plate 22b and a circular subhousing 22c extending between the plates 22a and 22b. Preferably, the plates 22a and 22b and the subhousing 22c are molded together to form an integral structure. Four openings 24a-24d are formed through the respective corners of the plate 22a and four openings 25a-25d are formed through the respective corners of the plate 22b and are in alignment with the openings 24a-24d, respectively.

A finger guard 26 is provided which has a width and a height substantially corresponding to the width and height of the front plate 22a of the fan housing 22. The finger guard 26 is adapted to be mounted to the front plate 22a and has relatively large arcuate slots cut therein to permit air to pass therethrough yet prevent access to the fan rotor 24. Four locking posts 28a-28d are formed integrally with, and project from, the rear face of the finger guard 26 towards the fan housing 22 for securing the finger guard in its mounted position, as will be explained in detail.

The assembly 20 also includes a mounting frame 30 which has a height and width substantially corresponding to the height and width of the rear plate 22b of the fan housing 20. Four locking posts 32a-32d project from the corners of the frame 30 and extend towards the housing 22. The posts 28a-28d, the posts 32a-32d, the openings 24a-24d, and the openings 25a-25d are respectively aligned to enable the finger guard 26 and the fan housing 22 to be connected to the mounting plate 30 in a manner to be described.

Four mounting hooks 34a-34d extend from the respective corners of the rear surface of the frame 30 and towards the wall 16 of the enclosure 12. Four L-shaped slots 36a-36d extend through the wall 16 and are located and sized for receiving the mounting hooks 34a-34d on the frame 30.

A snap finger 38 extends from the upper portion of the frame 30, as viewed in FIG. 2 and includes a leading edge portion 38a which projects slightly from the rear surface of the frame 30 and towards the wall 16. An elongated, horizontally-extending, slot 36e is also formed through the rear wall 16 and is located and sized to receive the edge portion 38a of the snap finger 38.

FIG. 3A depicts the details of the respective end portions of the posts 28a and 32a, it being understood that the other posts 28b-28d extending from the finger guard 26 are identical to the post 28a; and that the posts 32b-32d extending from the frame 30 are identical to the post 32a. Each post 28a and 32a is formed by two split portions extending at 90 degrees to each other, and a crush rib 32a' is provided on the post 32a. The inner surfaces of the split portions of the post 28a and the split portions of the post 32a are formed with teeth and the split portions are arranged so that, when the posts are placed in an abutting relationship in a manner to be described, the respective teeth on the split portions of the posts engage, thus locking the posts relative to each other. When the posts 28a and 32a are in their abutting, locking position, portions of the posts, along with the crush rib 32a', extend in the opening 25a. This establishes a relatively tight connection sufficient to withstand the shock and vibration loads that are placed on the assembly and thus maintain the posts 28a and 32a in their locking position.

To mount the assembly 20 to the rear wall 16 of the enclosure 12, the finger guard 26 is advanced towards the fan housing 22 until the posts 28a–28d extend through the corresponding openings 24a–24d in the plate 22a of the housing. Further advancement of the finger guard 26 towards the housing 22 causes the posts 28a–28d to enter the corresponding openings 25a–25d in the plate 22b, until the leading face of the finger guard 26 engages the corresponding face of the plate 22a. The housing 22, along with the finger guard, is then advanced towards the frame 30 until the posts 32a–32d (FIG. 2) on the frame 30 extend in the corresponding openings 25a–25d in the plate 22b of the assembly 20, and the leading face of the plate 22b of the housing abuts the corresponding face of the frame 30. In this position, the teeth formed on the posts 32a–32d engage the teeth on the posts 28a–28d. As shown in FIG. 3A in connection with the posts 28a and 32a for example, the opening 25a guides the posts 28a and 32a into their engaging position and captures portions of the posts and the crush rib 32a' on the post 32a, to secure the posts in a very tight fit to withstand the aforementioned shock and vibration loads. The posts 28b–28d are locked to the posts 32b–32d, respectively, in the same manner, and, as a result, the finger guard 26 and the fan housing 22 are locked to the mounting plate 30.

The frame 30, with the housing 22 and the finger guard 26 attached thereto, is then positioned relative to the wall 16 as shown in FIG. 2 and advanced towards the wall until the hooks 34a–34d extend through the lower, widened portions of their respective L-shaped slots 36a–36d. The frame 30, and therefore the housing 22 and the finger guard 26, are then moved upwardly until the hooks 34a–34d extend in the upper, relatively narrow, portions of the slots 36a–36d, respectively. In this position, the leading edge portion 38a of the snap finger 38 snaps into the slot 36e. As a result, any vertical or lateral movement of the frame 30 relative to the wall is prevented.

The mounting assembly of the present invention thus enjoys several advantages. For example, the fan and the finger guard can be installed in the enclosure with a minimum of parts and in a compact space no greater than the space normally taken up by the fan. Also, the assembly of the present invention can be easily installed in the enclosure in the foregoing manner using hooks and a snap finger for attaching the mounting frame to the enclosure, and using locking posts for attaching the fan housing and the finger guard to the mounting frame—techniques that are effective yet take up very little space. Further, the mounting assembly is equally applicable to "flange" type or "rib" type openings in the fan housing.

It is understood that several variations can be made in the foregoing without departing from the scope of the invention. For example, the aforementioned sequence of mounting steps can be varied within the scope of the invention. In this context, the finger guard 16 can be mounted to the housing 22 after the latter housing is mounted to the frame 30, or the frame 30 can initially be secured to the wall 16 in the manner described above, and the finger guard 26 and the fan housing 22 can then be mounted to the frame 30. Also, although the holes 24a–24d extending through the plate 22a of the fan housing 22 and the holes 25a–25d extending through the plate 22b are shown in the drawings as being of the well-known "flange" type, it is understood that the present invention is equally applicable to "rib" type holes which are also well known. Further, the posts 28a–28d and 32a–32d do not have to be formed integrally with the finger guard 26 and the mounting frame 30, respectively, but can be formed separately. Also, the mounting assembly of the present invention is not limited to use with a computer as described above by means of example, but is equally applicable for use with other equipment within the scope of the present invention. Still further, the mounting hooks 34a–34d and the snap finger 38 could be located inwardly of the fan perimeter so that even less space is used to mount the fan housing 22 to the enclosure wall 16.

It is also understood that the embodiment of the assembly of the present invention described above is intended to illustrate rather than limit the invention, and that the mounting assembly can take many other forms and embodiments within the scope of the invention.

What is claimed is:

1. A computer comprising an enclosure, a cooling fan disposed in the enclosure and comprising a housing for receiving a fan rotor and a motor and having at least one opening extending therethrough, a mounting plate attached to a wall of the enclosure, and a finger guard for covering the fan rotor, the housing extending between, and in abutment with, the mounting plate and the finger guard, at least one locking member extending from the mounting plate and into the opening in the housing, and at least one locking member extending from the finger guard and into the opening in the housing and in engagement with the locking member of the mounting plate to lock the finger guard and the housing to the mounting plate.

2. The computer of claim 1 wherein the locking members are in the form of posts, the end portions of each of which have a plurality of teeth, the respective teeth on the posts engaging in the locking relationship.

3. The computer of claim 1 wherein there are four through openings formed in the fan housing, four locking members extending from the mounting plate and four locking members extending from the finger guard and in engagement with the four locking members of the mounting plate, respectively.

4. The computer of claim 1 wherein the housing has at least one pair of flanges and an opening extends through each of the flanges, wherein the locking member extending from the finger guard extends through one of the opening and into the other, and wherein the locking member extending from the mounting plate extends into the other opening where it engages the locking member extending from the finger guard.

5. The computer of claim 4 wherein there are four pairs of through openings formed in the fan housing, four locking members extending from the mounting plate and four locking members extending from the finger guard and in engagement with the four locking members of the mounting plate, respectively.

6. A fan assembly for mounting in an equipment enclosure, the assembly comprising a housing for receiving a fan rotor and a motor and having at least one opening extending therethrough, a mounting plate adapted to be attached to a wall of the enclosure, and a finger guard for covering the fan rotor, the housing extending between, and in abutment with, the mounting plate and the finger guard, at least one locking member extending from the mounting plate and into the opening in the housing, and at least one locking member extending from the finger guard and into the opening in the housing and in engagement with the locking member of the mounting plate to lock the finger guard and the housing to the mounting plate.

7. The assembly of claim 6 wherein the locking members are in the form of posts, the end portions of each of which have a plurality of teeth, the respective teeth on the posts engaging in the locking relationship.

8. The assembly of claim 6 wherein there are four through openings formed in the fan housing, four locking members extending from the mounting plate and four locking members extending from the finger guard and in engagement with the four locking members of the mounting plate, respectively.

9. The assembly of claim 6 wherein the housing has at least one pair of flanges and an opening extends through each of the flanges, wherein the locking member extending from the finger guard extends through one of the opening and into the other, and wherein the locking member extending from the mounting plate extends into the other opening where it engages the locking member extending from the finger guard.

10. The assembly of claim 9 wherein there are four pairs of through openings formed in the fan housing, four locking members extending from the mounting plate and four locking members extending from the finger guard and in engagement with the four locking members of the mounting plate, respectively.

11. A fan assembly for mounting in an equipment enclosure, the assembly comprising a housing for receiving a fan rotor and a motor, a mounting plate adapted to be attached to a wall of the enclosure, a finger guard for covering the fan rotor, the housing extending between, and in abutment with, the mounting plate and the finger guard, means for mounting the mounting plate to the wall, and means for connecting the housing and the finger guard to the mounting means, the connecting means being confined within the outer dimensions of the housing so as to not take up any additional space in the enclosure.

12. The assembly of claim 11 wherein the connecting means comprises at least one locking member extending from the mounting member and into an opening in the housing, and at least one locking member extending from the finger guard and into the opening in the housing and in engagement with the locking member of the mounting plate to lock the finger guard and the housing to the mounting plate.

13. The assembly of claim 12 wherein the locking members are in the form of posts, the end portions of each of which have a plurality of teeth, the respective teeth on the posts engaging in the locking relationship.

14. The assembly of claim 12 wherein there are four through openings formed in the fan housing, four locking members extending from the mounting plate and four locking members extending from the finger guard and in engagement with the four locking members of the mounting plate, respectively.

15. The assembly of claim 12 wherein the housing has at least one pair of flanges and an opening extends through each of the flanges, wherein the locking member extending from the finger guard extends through one opening and into the other, and wherein the locking member extending from the mounting plate extends into the other opening where it engages the locking member extending from the finger guard.

16. The assembly of claim 15 wherein there are four pairs of through openings formed in the fan housing, four locking members extending from the mounting plate and four locking members extending from the finger guard and in engagement with the four locking members of the mounting plate, respectively.

17. A fan assembly for mounting in an equipment enclosure, the assembly comprising a housing for receiving a fan rotor and a motor; a mounting plate adapted to be attached to a wall of the enclosure; a finger guard for covering the fan rotor; the housing extending between, and in abutment with, the mounting plate and the finger guard; means for mounting the mounting plate to the wall; and means for connecting the housing and the finger guard to the mounting plate, the connecting means comprising at least one locking member extending from the mounting plate and into an opening in the housing, and at least one locking member extending from the finger guard and into the opening in the housing and in engagement with the locking member of the mounting plate.

\* \* \* \* \*